United States Patent
Yeh et al.

(10) Patent No.: US 8,326,905 B2
(45) Date of Patent: Dec. 4, 2012

(54) TRANSVERSAL FILTER CIRCUIT WITH A PLURALITY OF DELAY UNITS, MULTIPLEXERS, AND FULL ADDERS SUITED FOR A SMALLER DECISION FEEDBACK EQUALIZER

(75) Inventors: Shih-Yi Yeh, Hsinchu County (TW); Ruei-Dar Fang, Hsinchu County (TW)

(73) Assignee: Ralink Technology Corporation, Hsinchu County (TW)

( * ) Notice: Subject to any disclaimer, the term of this patent is extended or adjusted under 35 U.S.C. 154(b) by 832 days.

(21) Appl. No.: 12/470,972

(22) Filed: May 22, 2009

(65) Prior Publication Data

US 2010/0027612 A1 Feb. 4, 2010

(30) Foreign Application Priority Data

Jul. 31, 2008 (TW) .............................. 97128940 A

(51) Int. Cl.
*H04L 27/01* (2006.01)
*G06F 17/10* (2006.01)

(52) U.S. Cl. ........ 708/319; 708/300; 708/316; 708/322; 375/229; 375/232; 375/233

(58) Field of Classification Search .................. 708/319, 708/316, 322; 375/229, 232
See application file for complete search history.

(56) References Cited

U.S. PATENT DOCUMENTS

| | | | | |
|---|---|---|---|---|
| 5,394,110 A * | 2/1995 | Mizoguchi | ..................... | 329/304 |
| 5,526,377 A | 6/1996 | Yedid et al. | | |
| 7,007,053 B1 * | 2/2006 | Malik et al. | ................... | 708/300 |
| 7,251,297 B2 * | 7/2007 | Agazzi | .......................... | 375/340 |
| 2004/0181497 A1 * | 9/2004 | Dodgson | ......................... | 706/23 |
| 2007/0217497 A1 * | 9/2007 | Takahashi et al. | ............ | 375/232 |

OTHER PUBLICATIONS

Taiwanese Office Action dated Aug. 29, 2011 for 097128940, which is a corresponding Taiwanese application, that cites US 5526377.

* cited by examiner

*Primary Examiner* — Tammara Peyton
(74) *Attorney, Agent, or Firm* — WPAT, P.C.; Anthony King

(57) ABSTRACT

A transversal filter circuit comprises a plurality of delay units, a plurality of multiplexers and a plurality of full adders. The plurality of delay units is coupled in series to delay a two-bit input signal. The plurality of multiplexers is coupled to the plurality of delay units in a one-to-one manner, and outputs zero, a data signal, or the inverse of the data signal according to the output signals of the plurality of delay units. The plurality of full adders accumulates the outputs of the plurality of multiplexers and the MSB of the outputs of the plurality of the delay units.

20 Claims, 3 Drawing Sheets

TRANSVERSAL FILTER CIRCUIT WITH A PLURALITY OF DELAY UNITS, MULTIPLEXERS, AND FULL ADDERS SUITED FOR A SMALLER DECISION FEEDBACK EQUALIZER

BACKGROUND OF THE INVENTION (A) Field of the Invention

The present invention relates to an equalizer circuit, and more particularly, to a transversal filter circuit.

(B) Description of the Related Art

Equalizer circuits, also known as equalization filter circuits, which can adjust the frequency response of an input signal, are often applied in digital circuits to reduce the signal noise, enhance the signal accuracy or generate a new signal. A basic digital equalization operation multiplies the frequency responses of an equalizer and an input signal to obtain a new signal, wherein the corresponding operation in time-field is the convolution operation. A convolution operation can be described as $$y[n] = \sum_{k=0}^{m-1} w[k]x[n-k],$$

wherein x[n] is an input signal, y[n] is an output signal, w[n] represents the coefficients of the digital equalization operation in time-field and m is the number of coefficients. A transversal filter circuit is the implementation of the convolution operation, comprising a plurality of delay units, a plurality of multipliers and a plurality of adders. The delay units provide a plurality of input signals x[n] to x[n−m+1]. The multipliers multiply the coefficients of the digital equalization operation and the plurality of input signals. The adders accumulate the products outputted by the multipliers.

In the IEEE 802.3 100 BASE-TX standard, a structure of decision feedback equalizer is utilized to deal with the intersymbol interference (ISI) problem. FIG. 1 shows the block diagram of a conventional decision feedback equalizer 100. The decision feedback equalizer 100 comprises a feed forward filter 110, a feedback filter 120, an adder 130 and a detector 140, wherein the feed forward filter 110 and the feedback filter 120 are both transversal filters. The adder 130 subtracts a previously determined output signal from a presence signal so that the noise in the presence signal caused by the remaining previous signal is eliminated. The detector 140 then determines the output signal.

FIG. 2 shows the block diagram of a conventional transversal filter applied as a feedback filter in a decision feedback equalizer. The transversal filter 200 comprises a plurality of delay units 210, a plurality of multiplexer 220, a plurality of first-level adders 230, a plurality of second-level adders 240 and a plurality of inverters 250. Applying the IEEE 802.3 100 BASE-TX standard, the input signal of the transversal filter 200 is a two-bit signal with "multi-level transmit with 3 voltage levels" (MLT-3) representation. That is, the value of the input signal of the transversal filter 200 is 2'b00, 2'b01 or 2'b10, representing 0, 1 and −1 respectively. The transversal filter 200 corresponds to a convolution operation $$y[n] = \sum_{k=0}^{m-1} w[k]x[n-k],$$

wherein m is the number of delay units 210, x[n] is represented by $x_n$ and w[n] is represented by $w_n$ in FIG. 2. As shown in FIG. 2, since the value of the input signal of the transversal filter 200 is either 0, −1 or 1, the multiplication operation can be achieved by the plurality of multiplexer 220. When one of the input signals $x_k$ is 0, the corresponding multiplexer 220 outputs 0. When one of the input signals $x_k$ is 1, the corresponding multiplexer 220 outputs the corresponding coefficient $w_k$. When one of the input signals $x_k$ is −1, the corresponding multiplexer 220 outputs the corresponding coefficient $-w_k$. The coefficients w[n] are usually multi-bit numerals, such as 8-bit numerals, and are often represented by 2's complement representation. Therefore, the representation of $-w_k$ is implemented by taking the complement of each bits of $w_k$, and adding this numeral to 1. The first-level adders 230 and the inverters 250 achieve the aforesaid inversion operation.

For the transversal filter 200 with a total of m coefficients w[n], it requires a total of m first-level adders 230. In addition, the transversal filter 200 also requires a total of m−1 second-level adders 240 to accumulate the output signals of the multiplexers 220. As a result, the transversal filter 200 requires a total of 2m−1 adders, which does not meet the requirement of small circuit area and low cost for modern digital circuit design.

SUMMARY OF THE INVENTION

A transversal filter according to one embodiment of the present invention comprises a plurality of delay units, a plurality of multiplexers and a plurality of full adders. The plurality of delay units is serially coupled, and is configured to delay a two-bit input signal. The control input terminals of the multiplexers are coupled to the output terminals of the plurality of delay units in a one-to-one manner. The data input terminals of each multiplexer are coupled to zero, a data signal or the inverse of the data signal. The plurality of full adders is coupled in tree structure. The numeral input terminals of each full adder are coupled to the output terminal of another full adder in the upper layer or the output terminal of one of the multiplexers. The carry-in input terminal of each full adder is coupled to the most significant bit of the output terminal of one of the delay units.

A transversal filter according to another embodiment of the present invention comprises a plurality of delay units, a plurality of multiplexers and a plurality of full adders. The plurality of delay units is serially coupled, and is configured to delay a two-bit input signal. The plurality of multiplexers is configured to output zero, data signals or the inverse of the data signals according to the output signals of the delay units, wherein the inverse of the data signals are not produced by adders. The plurality of full adders is configured to accumulate the output signals of the plurality of multiplexers and the most significant bits of the output signals of the plurality of delay units.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Embodiments of the present invention will now be described more fully with reference to the accompanying drawings. The present invention may, however, be embodied in many different forms and should not be construed as limited to the embodiments set forth herein. Rather, these embodiments are provided so that this disclosure will be thorough and complete, and will fully convey the scope of the present invention to those skilled in the art.

Figure 3:
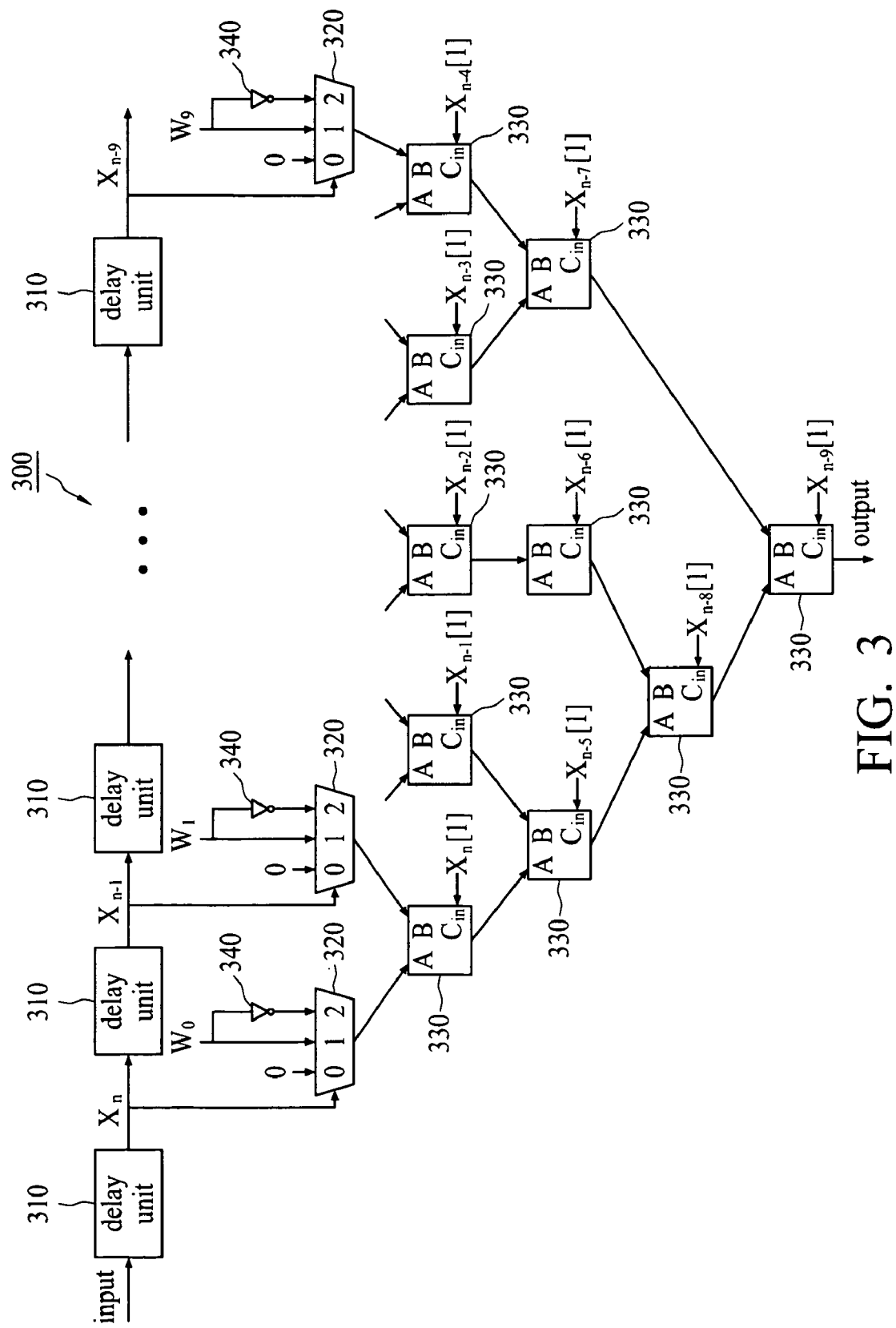
FIG. 3 shows the block diagram of a transversal filter according to embodiments of the present invention.

FIG. 3 shows the block diagram of a transversal filter according to embodiments of the present invention. The transversal filter 300 comprises a plurality of delay units 310, a plurality of multiplexers 320, a plurality of full adders 330 and a plurality of inverters 340. The plurality of delay units 310, implemented by a plurality of serially coupled registers, is configured to delay a two-bit input signal x[n]. The control input terminals of the multiplexers 320 are coupled to the output terminals of the delay units 310 in a one-to-one manner. The data input terminals of each multiplexer 320 are coupled to zero, a data signal w[n] or the inverse of the data signal w[n], wherein the inverters 340 provide the inverse of the data signal w[n]. The full adders 330 accumulate the output signals of the multiplexers 320 and the most significant bit (MSB) of the output signals of the delay units 310.

Figure 1:
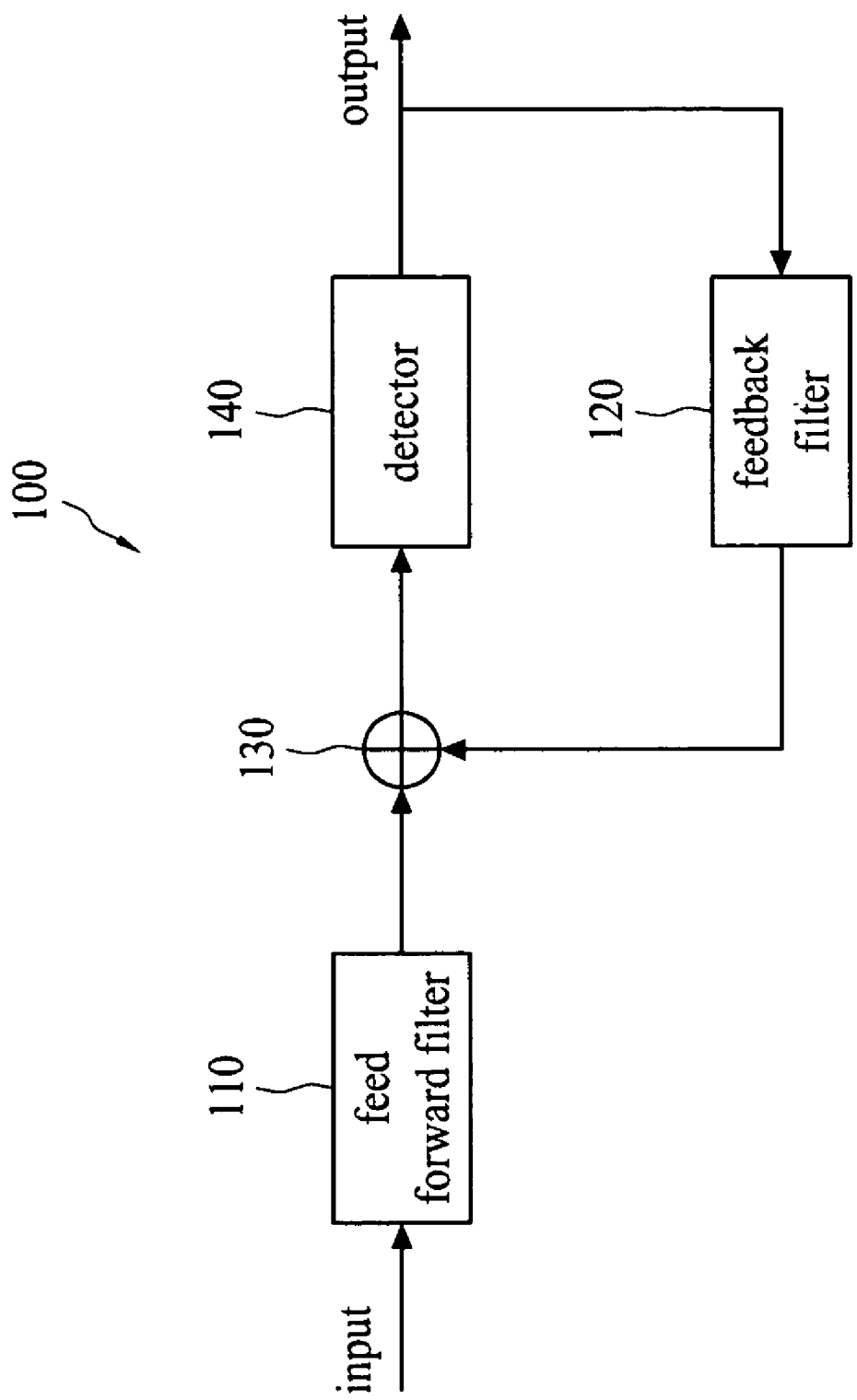
FIG. 1 shows the block diagram of a conventional decision feedback equalizer.
Figure 2:
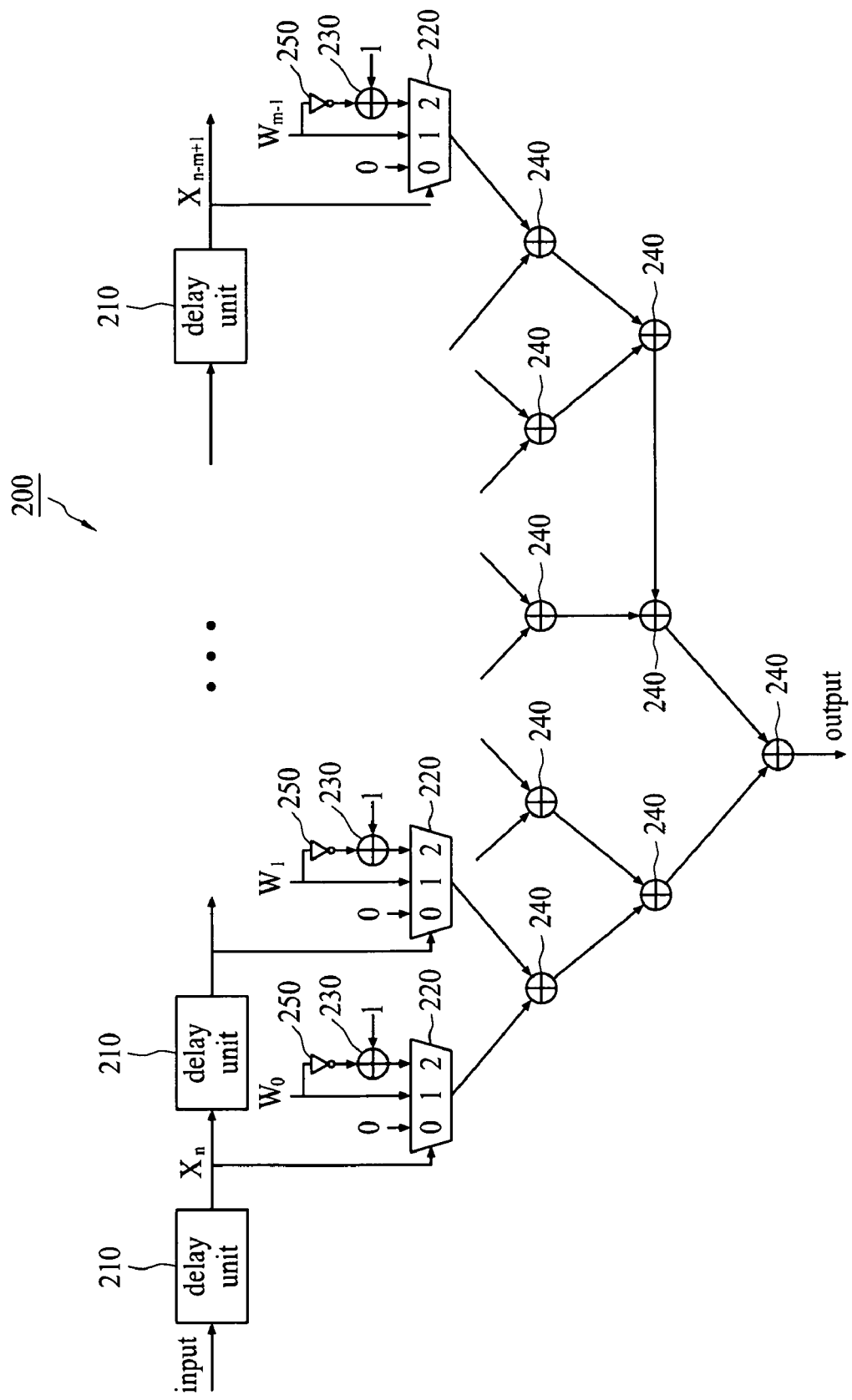
FIG. 2 shows the block diagram of a conventional transversal filter.

The transversal filter 300 shown in FIG. 3 is an improvement of the conventional transversal filter 200 shown in FIG. 2, and therefore can be represented as a convolution operation $$y[n] = \sum_{k=0}^{m-1} w[k]x[n-k],$$

wherein x[n] is an input signal, y[n] is an output signal, w[n] represents the coefficients of the equalization operation in time-field, i.e. a plurality of numeral signals, and m is the number of numeral signals, i.e. the number of delay units 310. The input signal x[n] is a two-bit signal with MLT-3 representation. That is, the value of the input signal x[n] is 2'b00, 2'b01 or 2'b10, representing 0, 1 and −1 respectively. As shown in FIG. 3, the input signal x[n] is represented by $x_n$, w[n] is represented by $w_n$ and the MSB of the input signal x[n] is represented by $x_n[1]$. In this embodiment, m equals 10. That is, the number of numeral signals w[n] is 10, and the number of delay units 310, multiplexers 320, full adders 330 and inverters 340 are all 10.

Referring to FIG. 2, since all of the operations in the transversal filter 200 are linear, the operation order can be changed. In other words, the first-level adders 230 can be shifted from ahead of the multiplexers 220 to behind the multiplexers 220. As shown in FIG. 2, only when the output signal of one of the delay units 210 is 2'b10 will the corresponding multiplexer 220 output signal via the corresponding first-level adder 230. In other words, only when the MSB of one of the delay units 310 equals 1 will the corresponding data path include the corresponding first-level adder 230. Therefore, the operation in the first-level adders 230 can be replaced by the operation of accumulating the MSB of the delay units 310.

The input terminals of each full adder 330 in the embodiment include two multi-bit numeral input terminals A and B and a single-bit carry-in input terminal $C_{in}$. The full adders 330 in FIG. 3 are disposed in multiple layers, wherein the numeral input terminals of each full adder 330 are coupled to the output terminal of another full adder 330 in the upper layer or the output terminal of one of the multiplexers 320, and the carry-in input terminal of each full adder 330 is coupled to the MSB of the output terminal of one of the delay units 310. Since the number of delay units 310 is 10, the transversal filter 300 requires at most 10 full adders 330.

The connection and the disposition of the transversal filter in the present invention is not limited by the transversal filter 300 shown in FIG. 3, but should include any connection and disposition which can achieve the convolution operation $$y[n] = \sum_{k=0}^{m-1} w[k]x[n-k].$$

For instance, the carry-in input of each full adder 330 can be shifted with the carry-in input of another full adder 330, or the numeral inputs of each full adder 330 can also be shifted with the numeral inputs of another full adder 330, as long as the convolution operation $$y[n] = \sum_{k=0}^{m-1} w[k]x[n-k]$$

is not altered.

In conclusion, for a transversal filter exhibiting a number of m delay units and an input signal with MLT-3 representation, the number of adders required by the transversal filter in the present invention is largely reduced, i.e., the number of required adders is reduced from 2m−1 to m as shown in FIG. 2 and FIG. 3. The transversal filter of the present invention exhibits the advantages of smaller size, faster operational speed and lower manufacturing costs, and therefore is well suited for a decision feedback equalizer.

The above-described embodiments of the present invention are intended to be illustrative only. Those skilled in the art may devise numerous alternative embodiments without departing from the scope of the following claims.

What is claimed is:

1. A transversal filter, comprising:
   a plurality of serially coupled delay units configured to delay a two-bit input signal;
   a plurality of multiplexers, each of the multiplexer having a control input terminal coupled to an output terminal of one of the delay units, and having data input terminals separately coupled to zero, a data signal and an inverse of the data signal; and
   a plurality of full adders coupled in a tree structure, each of the full adders having a numeral input terminal coupled to an output terminal of a full adder at an upper layer or an output terminal of one of the multiplexers, and having a carry-in input terminal coupled to a most significant bit of the output terminal of one of the delay units.

2. The transversal filter of claim 1, wherein when the control input of one of the multiplexers is 2'b01, the multiplexer outputs the data signal.

3. The transversal filter of claim 1, wherein when the control input of one of the multiplexers is 2'b10, the multiplexer outputs the inverse of the data signal.

4. The transversal filter of claim 1, wherein when the control input of one of the multiplexers is 2'b00, the multiplexer outputs zero.

5. The transversal filter of claim 1, wherein the quantity of delay units is equal to the quantity of multiplexers.

6. The transversal filter of claim 1, wherein the quantity of multiplexers is equal to the quantity of full adders.

7. The transversal filter of claim 1, wherein the two-bit input signal is represented in multi-level transmit with 3 voltage levels representation.

8. The transversal filter of claim 1, wherein the delay units are registers.

9. The transversal filter of claim 1, further comprising:
a plurality of inverters, each of the inverters configured to provide one of multiplexers with the inverse of the data signal, wherein an input terminal of each of the inverters is coupled to the data signal, and an output terminal of each of the inverters is coupled to one of multiplexers.

10. The transversal filter of claim 1, which is applied in a decision feedback equalization system.

11. A transversal filter, comprising:
a plurality of serially coupled delay units configured to delay a two-bit input signal;
a plurality of multiplexers, each of the multiplexer configured to output zero, a data signal or an inverse of the data signal according to an output signal of one of the delay units, wherein the inverse of the data signal is not generated by an adder; and
a plurality of full adders, each of the full adders configured to accumulate an output signal of one of the multiplexers and the most significant bit of the output signal of one of the delay units.

12. The transversal filter of claim 11, wherein when the output signals of one of the delay units is 1, the corresponding multiplexer outputs the data signal.

13. The transversal filter of claim 11, wherein when the output signal of one of the delay units is −1, the corresponding multiplexer outputs the inverse of the data signal.

14. The transversal filter of claim 11, wherein when the output signal of one of the delay units is 0, the corresponding multiplexer outputs zero.

15. The transversal filter of claim 11, wherein the quantity of delay units is equal to the quantity of multiplexers.

16. The transversal filter of claim 11, wherein the quantity of multiplexers is equal to the quantity of full adders.

17. The transversal filter of claim 11, wherein the two-bit input signal is represented in multi-level transmit with 3 voltage levels representation.

18. The transversal filter of claim 11, wherein the delay units are registers.

19. The transversal filter of claim 11, further comprising:
a plurality of inverters, each of the inverters configured to provide one of multiplexers with the inverse of the data signal, wherein an input terminal of each of the inverters is coupled to the data signal, and an output terminal of each of the inverters is coupled to one of multiplexers.

20. The transversal filter of claim 11, which is applied in a decision feedback equalization system.

* * * * *